US006348794B1

(12) United States Patent
Nabetani et al.

(10) Patent No.: US 6,348,794 B1
(45) Date of Patent: Feb. 19, 2002

(54) RF COIL FOR MAGNETIC RESONANCE IMAGING HAVING THREE SEPARATE NON-OVERLAPPING COILS ELECTRICALLY ISOLATED FROM EACH OTHER

(75) Inventors: Akira Nabetani; Kenji Sato; Takashi Ishiguro, all of Tokyo (JP)

(73) Assignee: GE Yokogawa Medical Systems, Limited, Tokyo (JP)

( * ) Notice: Subject to any disclaimer, the term of this patent is extended or adjusted under 35 U.S.C. 154(b) by 0 days.

(21) Appl. No.: 09/484,547

(22) Filed: Jan. 18, 2000

(51) Int. Cl.[7] .................................................. G01V 3/00
(52) U.S. Cl. .......................... 324/318; 324/322; 324/319
(58) Field of Search ............................... 324/322, 318, 324/319, 320, 309

(56) References Cited

U.S. PATENT DOCUMENTS

| 4,769,605 | A |   | 9/1988  | Fox .......................... 324/318 |
| 5,144,241 | A |   | 9/1992  | Duerr ........................ 324/318 |
| 5,144,243 | A |   | 9/1992  | Nakabayashi ............... 324/318 |
| 5,302,901 | A | * | 4/1994  | Snelton ...................... 324/322 |
| 5,708,361 | A |   | 1/1998  | Wang ......................... 324/318 |
| 5,973,495 | A | * | 10/1999 | Mansfield ................... 324/322 |

FOREIGN PATENT DOCUMENTS

| EP | 0412824 | 2/1991  |
| WO | 9634296 | 10/1996 |

* cited by examiner

Primary Examiner—Hezron Williams
Assistant Examiner—Brij B. Shrivastav
(74) Attorney, Agent, or Firm—Moonray Kojima

(57) ABSTRACT

An RF coil which is a coil array using three pieces or more of coils, including three pieces of coils 1, 2 and 3 or more arrayed proximately to each other, coil intermediary connecting capacitors 4, 5 and 6 respectively interposed in the coils, parallel connection lines 10 through 13 for connecting the coil intermediary connecting capacitors 4, 5 and 6 in parallel and neutralizing capacitors 14 through 17 interposed in the parallel connection lines 10 through 13 with an object of dispensing with mutual interference among the coils without overlapping the adjacent coils, in which by transmitted voltage transmitted from both ends of the coil intermediary connecting capacitor (4) of the one coil (1)to both ends of the coil intermediary connecting capacitors (5, 6)of the other coils (2, 3)via the parallel connection lines (10 through 13)and the neutralizing capacitors (14 through 17), induced voltage generated by the one coil (1) across the both ends of the coil intermediary connecting capacitors (5, 6)of the other coils (2, 3) via mutual inductance, is canceled, an MRI apparatus as well as an NMR signal receiving method using the RF coil.

20 Claims, 2 Drawing Sheets

RF coil 100

RF coil 100

RF COIL FOR MAGNETIC RESONANCE IMAGING HAVING THREE SEPARATE NON-OVERLAPPING COILS ELECTRICALLY ISOLATED FROM EACH OTHER

BACKGROUND OF THE INVENTION

1. Field of the Invention

The present invention relates to an RF coil, an MRI apparatus and an NMR signal receiving method, more particularly to an RF coil capable of excluding interaction among coils even in an arrangement in which the coils are arrayed proximately to each other without overlapping adjacent ones of the coils, an NMR apparatus having such an RF coil and an NMR signal receiving method using such an RF coil.

2. Related Art

According to a conventional MRI apparatus, there is used an RF coil integrated with three pieces or more of small coils. According to the conventional RF coil, in order to prevent interaction among the coils, the coils are arranged such that coil faces of adjacent ones of the coils are overlapped-by about 10% thereof.

However, it is inconvenient to restrict to the arrangement in which the coil faces of the adjacent coils are overlapped by about 10%.

SUMMARY OF THE INVENTION

Hence, it is an object of the present invention to provide an RF coil capable of dispensing with mutual interference among coils even in an arrangement in which adjacent coils are arrayed proximately to each other without overlapping adjacent ones of the coils, an MRI apparatus having the RF coil and a method of receiving NMR signals using the RF coil.

According to a first aspect of the present invention, there is provided an RF coil comprising three pieces or more of coils arrayed proximately to each other, coil intermediary connecting capacitors respectively interposed in the respective coils, parallel connection lines for connecting the coil intermediary connecting capacitors of the respective coils in parallel and neutralizing capacitors interposed in the parallel connection lines, wherein by transmitted voltage transmitted from both ends of the coil intermediary connecting capacitor of one of the coils to both ends of the coil intermediary connecting capacitor of other of the coils via the parallel connection lines and the neutralizing capacitors, induced voltage generated across the both ends of the coil intermediary connecting capacitor of other of the coils by the one of the coils via mutual inductance is canceled.

According to the RF coil of the first aspect of the present invention, the voltage generated by the one coil for canceling the voltage induced in the other coil by mutual inductance, is transmitted from the one coil to the other coil via the parallel connection lines and the neutralizing capacitors. Accordingly, the mutual interference among the coils can be dispensed with. Further, there can be arranged so that adjacent coils are arrayed proximately to each other without overlapping the coils.

According to a second aspect of the present invention, there is provided an MRI apparatus featured in comprising the RF coil according to the first aspect of the present invention.

According to the MRI apparatus of the second aspect of the present invention, three pieces or more of coils can be used without being limited to an arrangement in which coil faces of adjacent coils are made to overlap by about 10%.

In this way, according to the RF coil, the MRI apparatus and the NMR signal receiving method of the present invention, mutual interference among coils can be dispensed with in a coil array in which three pieces or more of the coils are used. Therefore, the S/N ratio can be promoted. Further, there can be constituted the arrangement in which adjacent coils are arrayed proximately to each other without overlapping the coils and the degree of freedom can be promoted.

Further objects and advantages of the present invention will be apparent from the following description of the preferred embodiments of the invention as illustrated in the accompanying drawings.

DETAILED DESCRIPTION OF THE PREFERRED EMBODIMENTS

A further detailed explanation will be given of the present invention by embodiments of the invention in reference to the drawings as follows.

First Embodiment

Figure 1:
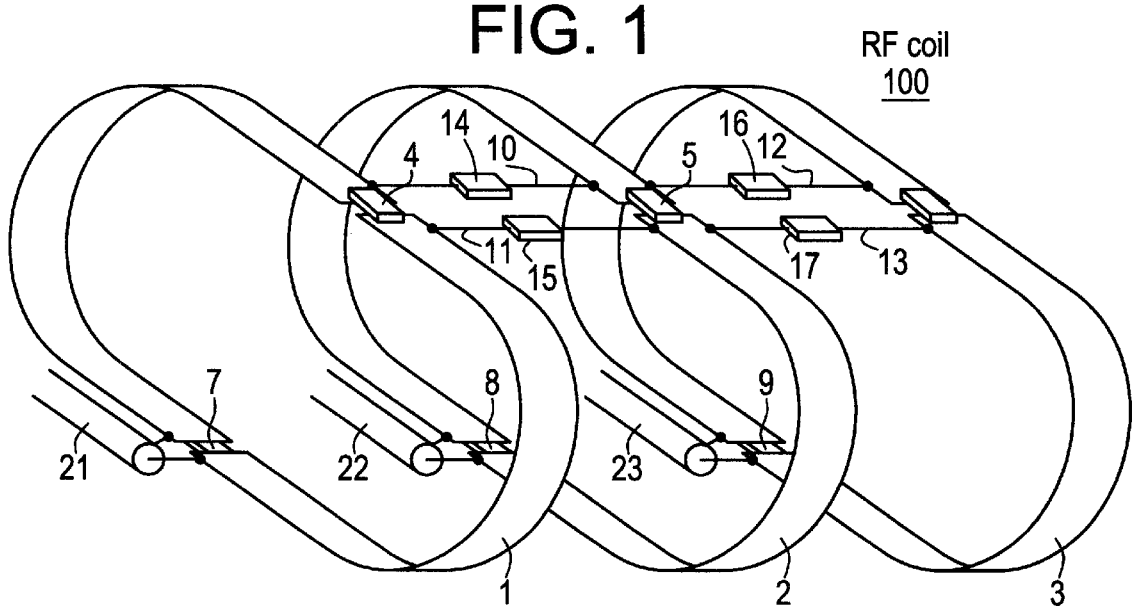
FIG. 1 is a perspective view of an RF coil according to a first embodiment of the present invention.

FIG. 1 is a perspective view of an RF coil according to a first embodiment of the present invention.

The RF coil 100 is provided with a first coil 1, a second coil 2 and a third coil 3, coil intermediary connecting capacitors 4, 5 and 6 and resonance capacitors 7, 8 and 9 respectively interposed in the coils 1, 2 and 3, parallel connection lines 10 through 13 for connecting the coil intermediary connecting capacitors 4, 5 and 6 of the respective coils 1, 2 and 3 in parallel and neutralizing capacitors 14 through 17 interposed in the parallel connection lines 10 through 13. Further, both ends of the resonance capacitors 7, 8 and 9 are respectively connected with coaxial cables 24, 25 and 26 via baluns 21, 22 and 23.

The first coil 1, the second coil 2 and the third coil 3 are respectively formed in a shape of an athletic track (for example, linear portions: about 330 mm, radii of semicircular portions: about 110 mm, conductor width: about 50 mm, conductor thickness: about 1 mm) and arrayed to be adjacent to each other (for example, intervals: about 150 mm) with respective coil faces thereof opposed to each other.

Figure 2:
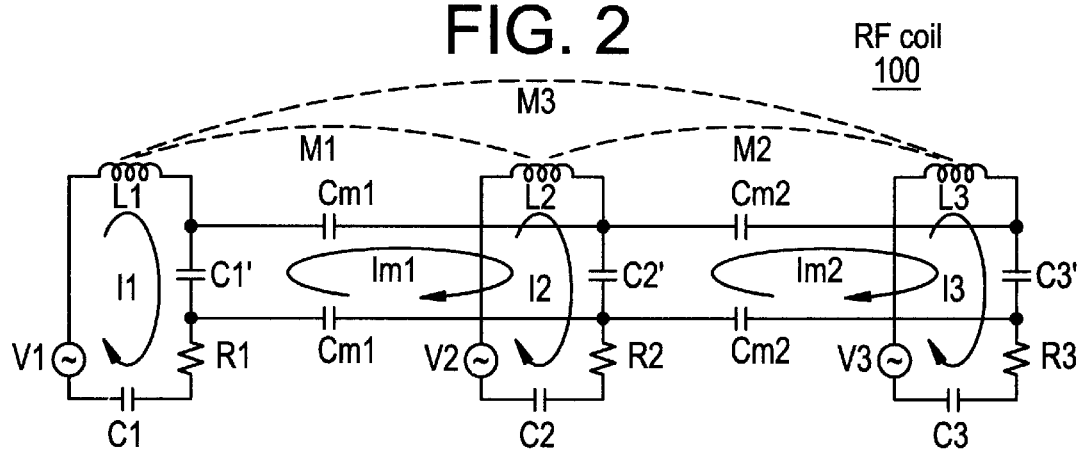
FIG. 2 is an equivalent circuit diagram of the RF coil according to the first embodiment of the present invention.

FIG. 2 is an equivalent circuit diagram of the RF coil 100.

Notations L1, L2 and L3 designate inductances of the first coil 1, the second coil 2 and the third coil 3.

Notations R1, R2 and R3 designate resistances of the first coil 1, the second coil 2 and the third coil 3.

Notations V1, V2 and V3 designate electromotive forces (for example, induced by NnR signal) of the first coil 1, the second coil 2 and the third coil 3.

Notations I1, I2 and I3 designate loop currents flowing in the first coil 1, the second coil 2 and the third coil 3.

Notation M1 designates mutual inductance between the first coil 1 and the second coil 2.

Notation M2 designates mutual inductance between the second coil 2 and the third coil 3.

Notation M3 designates mutual inductance between the first coil 1 and the third coil 3.

Notations C1, C2 and C3 designate capacitances of the resonance capacitors 7, 8 and 9.

Notations C1', C2' and C3' designate capacitances of the coil intermediary connecting capacitors 4, 5 and 6.

Notations Cm1, Cm1, Cm2 and Cm2 designate capacitances of the neutralizing capacitors 14, 15, 16 and 17.

Notation Im1 designates loop current flowing in a loop formed by the coil intermediary connecting capacitor 4, the neutralizing capacitor 14, the coil intermediary connecting capacitor 5 and the neutralizing capacitor 15.

Notation Im2 designates loop current flowing in a loop formed by the coil intermediary connecting capacitor 5, the neutralizing capacitor 16, the coil intermediary connecting capacitor 6 and the neutralizing capacitor 17.

In the equivalent circuit of FIG. 2, when an object angular frequency is designated by notation, the following circuit equations are established.

$$V_1 = \left\{R_1 + j\left(\omega L_1 - \frac{1}{\omega C_1} - \frac{1}{\omega C_1'}\right)\right\}I_1 + j\omega M_1 I_2 + j\omega M_3 I_3 + j\frac{1}{\omega C_1'}I_{m1} \quad (1)$$

$$V_2 = j\omega M_1 I_1 + \left\{R_2 + j\left(\omega L_2 - \frac{1}{\omega C_2} - \frac{1}{\omega C_2'}\right)\right\}I_2 + \quad (2)$$

$$j\omega M_2 I_2 - j\frac{1}{\omega C_2'}(I_{m1} - I_{m2})$$

$$V_3 = j\omega M_3 I_1 + j\omega M_2 I_2 + \left\{R_3 + j\left(\omega L_3 - \frac{1}{\omega C_3} - \frac{1}{\omega C_3'}\right)\right\}I_3 - j\frac{1}{\omega C_3'}I_{m2} \quad (3)$$

$$0 = \left(-\frac{1}{C_1'}I_1 + \frac{1}{C_2'}I_2\right) + \left(\frac{1}{C_1'} + \frac{1}{C_2'} + \frac{2}{C_{m1}}\right)I_{m1} - \frac{1}{C_2'}I_{m2} \quad (4)$$

$$0 = \left(-\frac{1}{C_2'} + \frac{1}{C_3'}I_3\right) - \frac{1}{C_2'}I_{m1} + \left(\frac{1}{C_2'} + \frac{1}{C_3'} + \frac{2}{C_{m2}}\right)I_{m2} \quad (5)$$

Solving the equations in respect of Im1 and Im2 from Equations (4) and (5), $$I_{m1} = -\frac{1}{\alpha}\left(\frac{d}{C_1'}I_1 + \frac{d-b}{C_2'}I_2 + \frac{b}{C_3'}I_3\right) \quad (6)$$

$$I_{m2} = -\frac{1}{\alpha}\left(\frac{b}{C_1'}I_1 + \frac{b-a}{C_2'}I_2 + \frac{a}{C_3'}I_3\right) \quad (7)$$

$$\begin{cases} a = \frac{1}{C_1'} + \frac{1}{C_2'} + \frac{2}{C_{m1}} \quad b = \frac{1}{C_2'} \quad d = \frac{1}{C_2'} + \frac{1}{C_3'} + \frac{2}{C_{m2}} \\ \alpha = ad - b^2 = \left(\frac{1}{C_1'} + \frac{1}{C_2'} + \frac{2}{C_{m1}}\right)\left(\frac{1}{C_2'} + \frac{1}{C_3'} + \frac{2}{C_{m2}}\right) - \left(\frac{1}{C_2'}\right)^2 \end{cases}$$

Rearranging Equations (1), (2) and (3) by using Equations (6) and (7), $$V_1 = \left\{R_1 + j\left(\omega L_1 - \frac{1}{\omega C_1} - \frac{1}{\omega C_1'} + \frac{d}{\alpha \omega C_1'^2}\right)\right\}I_1 + \quad (1)'$$

$$j\left(\omega M_1 - \frac{d-b}{\alpha \omega C_1' C_2'}\right)I_2 + j\left(\omega M_3 - \frac{b}{\alpha \omega C_3' C_1'}\right)I_3$$

$$V_2 = j\left(\omega M_1 - \frac{d-b}{\alpha \omega C_1' C_2'}\right)I_1 + \quad (2)'$$

$$\left\{R_2 + j\left(\omega L_2 - \frac{1}{\omega C_2} - \frac{1}{\omega C_2'} + \frac{a+d-2b}{\alpha \omega C_2'^2}\right)\right\}I_2 +$$

$$j\left(\omega M_2 - \frac{a-b}{\alpha \omega C_2' C_3'}\right)I_3$$

$$V_3 = j\left(\omega M_3 - \frac{b}{\alpha \omega C_3' C_1'}\right)I_1 + j\left(\omega M_2 - \frac{a-b}{\alpha \omega C_1' C_3'}\right)I_2 + \quad (3)'$$

$$\left\{R_3 + j\left(\omega L_3 - \frac{1}{\omega C_3} - \frac{1}{\omega C_3'} + \frac{a}{\alpha \omega C_3'^2}\right)\right\}I_2$$

In order to dispense with the mutual interference among coils, the conditions are that cross talk terms in Equations (1)', (2)' and (3)' become "0". Accordingly, $$\omega M_1 - \frac{d-b}{\alpha \omega C_1' C_2'} = 0 \quad (8)$$

$$\omega M_2 - \frac{a-b}{\alpha \omega C_2' C_3'} = 0 \quad (9)$$

$$\omega M_3 - \frac{b}{\alpha \omega C_3' C_1'} = 0 \quad (10)$$

Eliminating ω from Equations (8) and (9), $$C_{m2} = \frac{2C_3' M_3}{M_1 - M_3} \quad (18)$$

Eliminating ω from Equations (9) and (10), $$C_{m1} = \frac{2C_1' M_3}{M_2 - M_3} \quad (19)$$

In the meantime, the respective coils 1 through 3 must be resonated at the object angular frequency ω and accordingly, underlined terms in Equations (1)', (2)' and (3)' need to be "0".

Hence, as a result, values of the capacitors may be set as follows.

(Step 1) The coils 1 through 3 are fabricated and the inductances L1 through L3 are measured.

(Step 2) The coils 1 through 3 are disposed in a desired arrangement and the mutual inductances M1 through M3 are measured.

(Step 3) C1' is pertinently determined. Then, Cm1 is determined from Equation (19).

(Step 4) C3' is pertinently determined. Then, Cm2 is determined from Equation (18).

(Step 5) C2, is determined such that Equations (8), (9) and (10) are established by the object angular frequency The mutual interference among three pieces of the coils 1 through 3 can be dispensed with by Step 1 through Step 5, described above.

(Step 6) C1 is determined such that the underlined term in Equation (1)' becomes "0".

(Step 7) C2 is determined such that the underlined term in Equation (2)' becomes "0".

(Step 8) C3 is determined such that the under lined term in Equation (3)' becomes "0".

The resonance frequencies of three pieces of the coils 1 through 3 can be matched to ω by Step 6 through Step 8, described above.

Here, C1'=C3' for simplifying the condition.

Solving the equations in respect of C2' by substituting Equations (18) and (19) for Equation (10), $$C'_2 = \frac{M_3\{1 - \omega^2 C'_1(M_1 + M_2)\}}{\omega^2 M_1 M_2} \quad (20)$$

C2' must be a positive value. Accordingly, $$1 - \omega^2 C'_1(M_1 + M_2) > 0 \Rightarrow C'_1 < \frac{1}{\omega^2(M_1 + M_2)} \quad (21)$$

In the meantime, when Equations (18), (19) and (20) are substituted for the underlined terms in Equations (1)', (2)' and (3)', and conditions for making the terms "0" (condition of providing solution) are calculated, $$①' \rightarrow C_{1'} > \frac{M_2 - M_3}{\omega M_2} \frac{1}{\omega L_1 - \frac{M_1 M_3}{M_2}\omega} \quad (22)$$

$$②' \rightarrow L > \frac{M_1 M_2}{M_3} \quad (23)$$

$$③' \rightarrow C_{1'} > \frac{M_1 - M_3}{\omega M_1} \frac{1}{\omega L_3 - \frac{M_2 M_3}{M_1}\omega} \quad (24)$$

Hence, values of the capacitors may be set as follows.

(Step a) The coils 1 through 3 are fabricated and the inductances L1 through L3 are measured.

(Step b) The coils 1 through 3 are disposed in a desired arrangement and the mutual inductances M1 through M3 are measured. At this occasion, the coils 1 through 3 are arranged such that Equation (23) is satisfied.

(Step c) C1' is determined such that Equations (21), (22) and (24) are satisfied. Then, Cm1 is determined from Equation (19).

(Step d) C3' and Cm2 are set such that C3'=C1' and Cm2=Cm1.

(Step e) C2' is determined from Equation (20).

(Step f) C1 is determined such that the underlined term in Equation (1)' becomes "0".

(Step g) C2 is determined such that the underlined term in Equation (2)' becomes "0".

(Step h) C3 is set such that C3=C1.

By the above-described procedure, the mutual interference among three pieces of the coils 1 through 3 can be dispensed with, further, the resonance can be carried out at the frequency ω.

Next, an explanation will be given of Step a through Step h by a numerical value example.

(Step a) The first coil 1, the second coil 2 and the third coil 3 are respectively formed in a shape of an athletic track and is made of copper with dimensions of linear portions of about 330 mm, radii of semicircular portions of about 110 mm, a conductor width of about 50 mm and a conductor thickness of about 1 mm. At this occasion, L=830 nH.

(Step b) The first coil 1, the second coil 2 and the third coil 3 are arrayed proximately to each other with respective coil faces opposed to each other and an interval between the first coil 1 and the second coil 2 and an interval between the second coil 2 and the third coil 3 are respectively about 150 mm. At this occasion, M1=M2=186.5 nH and M3=69.5 nH.

(Step c) From Equations (21), (22) and (23), 300 pF<C1'<620 pF and accordingly, C1' is set such that C1'=600 pF. When is set such that ω/2π=8.54 MHz, from Equation (19), Cm1 is calculated such that Cm1=712.8 pF.

(Step d) C2' and Cm2 are set such that C2'=C1'=600 pF and Cm2=Cm1=712.8 pF.

(Step e) From Equation (20), C2'=246.8pF is calculated.

(Step f) C1=874 pF is calculated from the condition in which the underlined term in Equation (1)' becomes "0".

(Step g) C2=1054 pF is calculated from the condition in which the underlined term in Equation (2)' becomes "0".

(Step h) C3 is set such that C3=C1=874 pF.

By the above-described procedure, there can be realized the RF coil 100 having no mutual interference in which three pieces of the coils 1 through 3 are arrayed proximately to each other.

Figure 3:
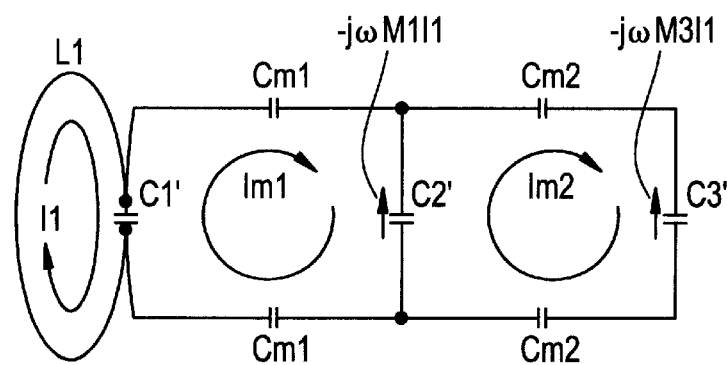
FIG. 3 is an equivalent circuit diagram of essential portions paying attention to an influence caused by a first coil.

FIG. 3 is an equivalent circuit diagram of essential portions assuming a case in which only the loop current I1 of the first coil 1 flows.

By the loop current I1 of the first coil 1 and the intercoil mutual operation M1 and M2, induced voltage of −jωM1I1 is generated across both ends of the coil intermediary connecting capacitor 5 (C2') of the second coil 2 and induced voltage of −jωM3I1 is generated across both ends of the coil intermediary connecting capacitor 6 (C3') of the third coil 3.

In the meantime, voltage across both ends of the coil intermediary connecting capacitor 4 (C1') of the first coil 1 is transmitted to the both ends of the coil intermediary connecting capacitor (C2') of the second coil 2 via the neutralizing capacitors 14 (Cm1) and 15 (Cm1) and is transmitted to the both ends of the coil intermediary connecting capacitors 6 (C3') of the third coil 3 further via the neutralizing capacitors 16 (Cm2) and 17 (Cm1).

When the induced voltage −jωM1I1 generated across the both ends of the coil intermediary connecting capacitor 5 (C2') of the second coil 2, is canceled by the voltage transmitted to the both ends of the coil intermediary connecting capacitor 5 (C2') via the neutralizing capacitors 14 (Cm1) and 15 (Cm1), the first coil 1 does not effect influence on the second coil 2. That is, the first coil 1 does not effect influence on the second coil 2 when the following equation is established.

$$-j\frac{1}{\omega C'_2}(I_{m1} - I_{m2}) = -j\omega M_1 I_1 \quad (11)$$

Further, when induced voltage −jωM3I1 generated across the both ends of the coil intermediary connecting capacitor 6 (C3') of the third coil 3 is canceled by the voltage transmitted to the both ends of the coil intermediary connecting capacitor 6 (C3') of the third coil 3 via the neutralizing capacitors 14 (Cm1), 15 (Cm1), 16 (Cm2) and 17 (Cm2), the first coil 1 does not effect influence on the third coil 3.

$$-j\frac{1}{\omega C'_3}I_{m2} = -j\omega M_3 I_1 \quad (12)$$

Next, the following equation is established in the loop circuit in which the loop current Im1 flows.

$$-j\frac{1}{\omega C_1'}I_1 + j\left(\frac{1}{\omega C_1'} + \frac{1}{\omega C_2'} + \frac{2}{\omega C_{m1}'}\right)I_{m1} - j\frac{1}{\omega C_2'}I_{m2} = 0 \quad (13)$$

Next, the following equation is established in the loop circuit in which the loop current Im2 flows.

$$-j\frac{1}{\omega C_2'}I_{m1} + j\left(\frac{1}{\omega C_2'} + \frac{1}{\omega C_3'} + \frac{2}{\omega C_{m2}'}\right)I_{m2} = 0 \quad (14)$$

From Equations (11) through (14), Equations (8) and (10), mentioned above, are derived.

Equation (9), mentioned above, is derived assuming a case in which only the loop current I2 of the second coil 2 flows (or, a case in which only the loop current I3 of the third coil 3 flows) similar to the above-described.

Accordingly, it can be understood that Equations (8), (9) and (10), mentioned above, signify that by transmitted voltage transmitted from both ends of a coil intermediary connecting capacitor of one coil to both ends of a coil intermediary connecting capacitor of other coil via parallel connection lines and neutralizing capacitors, induced voltage generated across both ends of the coil intermediary connecting capacitor of the other coil by the one coil via mutual inductance is canceled.

According to the RF coil 100, mentioned above, there is no intercoil mutual operation and accordingly, influence of a noise component of other coil is not effected and NMR signals in respective allocated regions can be received by three pieces of the coils 1, 2 and 3 independently from each other. Therefore, compared with the case in which the intercoil mutual operation is present, the S/N ratio can be promoted.

Further, the RF coil 100, mentioned above, can be used as a transmitting coil as well as a receiving coil.

Second Embodiment

Figure 4:
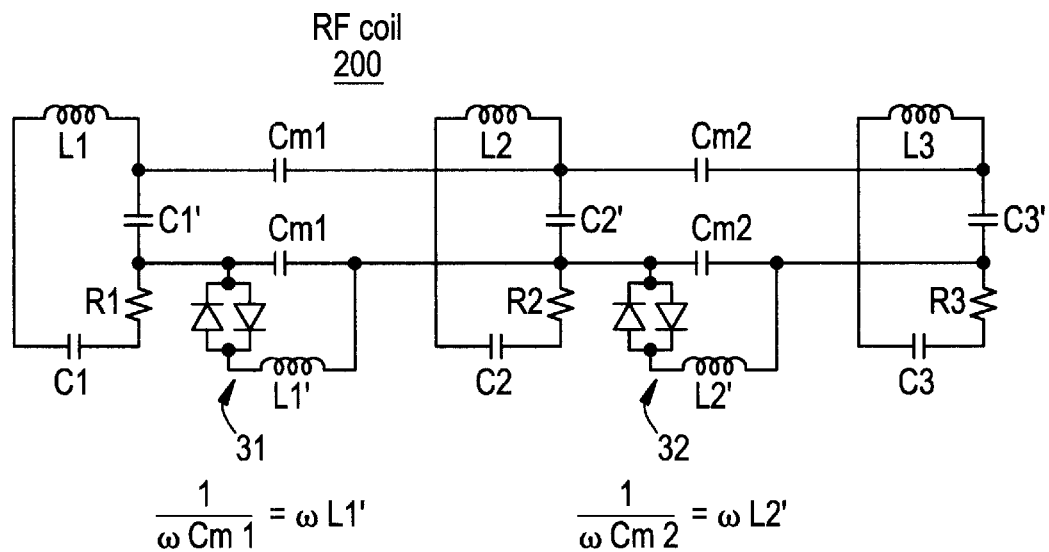
FIG. 4 is an equivalent circuit diagram of an RF coil according to a second embodiment of the present invention.

FIG. 4 is an equivalent circuit of an RF coil according to a second embodiment of the present invention.

The RF coil 200 is constituted so that passive decoupling circuits 31 and 32 are added to the RF coil 100 according to the first embodiment.

By adding the passive decoupling circuits 31 and 32 in this way, when transmission at high frequency is carried out from other transmitting coil, current can be prevented from flowing in the RF coil 200.

Accordingly, the RF coil 200 is useful as a reception exclusive coil.

Third Embodiment

Although according to the first embodiment and the second embodiment, the neutralizing capacitors 14 and 15 respectively having the equal capacitance Cm1 are interposed in the parallel connection lines 10 and 11, these may be provided with capacitances different from each other. Further, although the neutralizing capacitors 16 and 17 respectively having the equal capacitance Cm2 are interposed in the parallel connection lines 12 and 13, these may be provided with capacitances different from each other.

Further, a single piece of a neutralizing capacitor may be interposed in only one of the parallel connection lines 10 and 11 and a single piece of a neutralizing capacitor may be interposed in only one of the parallel connection lines 12 and 13 or pluralities of pieces of neutralizing capacitors may respectively be interposed in the parallel connection lines 10, 11, 12 and 13.

In brief, voltage transmitted to both ends of a coil intermediary connecting capacitor may cancel induced electromotive force by intercoil mutual operation by the neutralizing capacitor.

Further, when the object angular frequency is high, in order to remove influence of floating capacitance, it is preferable to interpose respective pluralities of neutralizing capacitors in the parallel connection lines 10, 11, 12 and 13.

Fourth Embodiment

Although according to the first and the second embodiment, an explanation has been given of the RF coils 100 and 200 using three pieces of the coils 1, 2 and 3, also in the case of an RF coil using four pieces or more of coils, condition equations may be derived and values of coil intermediary connecting capacitors, neutralizing capacitors and resonance capacitors may be determined similar to the above-described.

Fifth Embodiment

Figure 5:
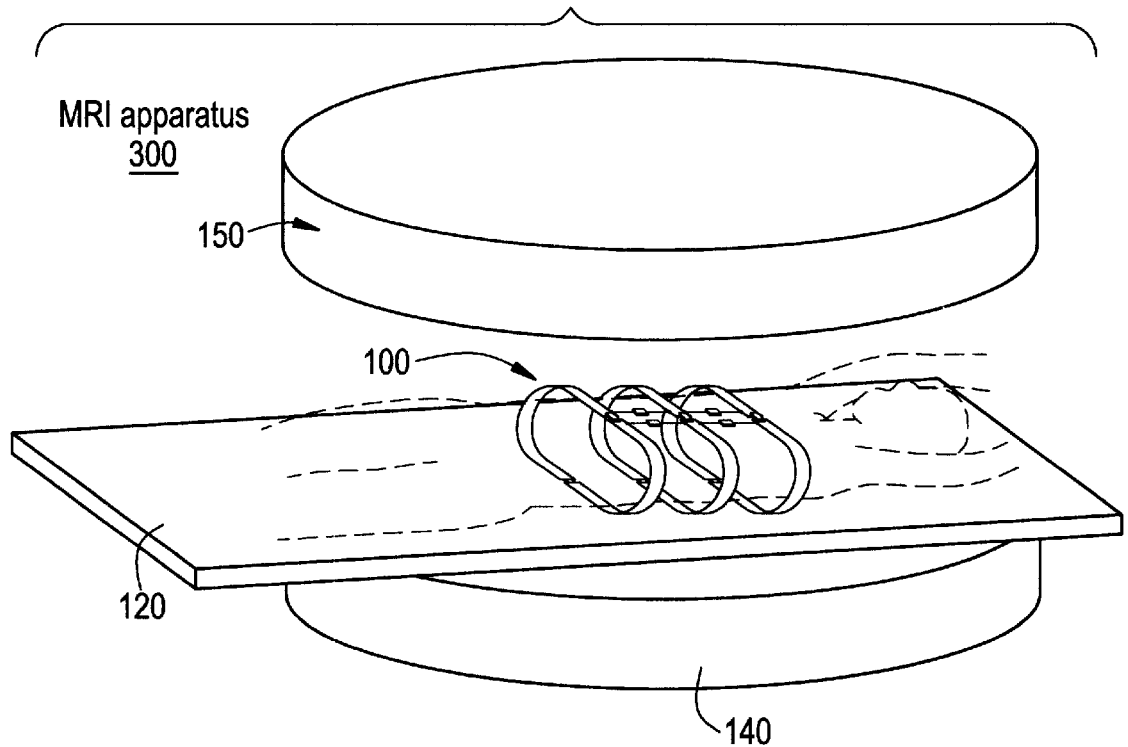
FIG. 5 is a perspective view of essential portions of an MRI apparatus according to a fifth embodiment of the present invention.

FIG. 5 is a perspective view showing essential portions of an MRI apparatus according to a fifth embodiment of the present invention.

The MRI apparatus 300 is a vertical magnetic field type MRI apparatus for generating a main magnetic field in the vertical direction and is provided with a lower magnet 140 and an upper magnet 150 which are opposed to each other in the up- and down direction, a cradle 120 going into and coming out from a space between the magnets 140 and 150 and the RF coil 100 installed above the cradle 120.

The RF coil 100 is the RF coil according to the present invention explained in the above-described embodiment and is installed such that a coil face thereof is directed in the longitudinal direction of the cradle 120.

A detected member (broken lines) is mounted above the cradle 120 such that a trunk portion thereof penetrates coil faces of the respective coils of the RF coil 100.

According to the MRI apparatus 300, there is no intercoil mutual operation among three pieces of the coils (1, 2 and 3) constituting the RF coil 100 and accordingly, NMR signals of respective allocated regions can be received by three pieces of the coils 1, 2 and 3 independently from each other without undergoing influence of a noise component of other coil. Accordingly, the S/N ratio can be promoted in comparison with a case in which the intercoil mutual operation is present.

Many widely different embodiments of the invention may be constructed without departing from the spirit and the scope of the present invention. It should be understood that the present invention is not limited to the specific embodiments described in the specification, except as defined in the appended claims.

What is claimed is:

1. An RF coil comprising:
   at least three separate, non-overlapping coils, each comprising a pair of flat elongated conductors disposed in an oblong structure with first and second ends of one conductor of each pair of conductors facing corresponding first and second ends of the other of each pair of conductors;
   means for connecting corresponding first ends of said conductors of said pair of conductors;

a plurality of first capacitors, each interconnecting corresponding second ends of conductors of each said pair of conductors;

a plurality of second capacitors; and means for connecting each of said second capacitors to respective second ends of said conductors of each of said at least three coils.

2. The coil of claim 1, wherein said first capacitor connecting said second ends of conductors in a first coil is equal in capacitance to said first capacitor connecting said second ends in a third coil.

3. The coil of claim 1, further comprising means for decoupling at least one of said second capacitors from connection respective second ends of said conductors.

4. The coil of claim 3, wherein said means for decoupling comprises a pair of diodes.

5. The coil of claim 1, wherein said means for connecting comprises a plurality of third capacitors, each connected to said first ends of said conductors.

6. The coil of claim 1, wherein said conductors comprise a conductive metal, and are of a length of about 330 mm; having a radius of about 110 mm; a width of about 50 mm; and a thickness of about 1 mm; and wherein distance between each of said at least three coils is about 150 mm.

7. The coil of claim 1, wherein inductance between a first coil and a second coil is about 186.5 nH; inductance between said second coil and a third coil is about 186.5 nH; and inductance between said first coil and said third coil is about 69.5 nH.

8. The coil of claim 1, wherein four separate, non-lapping coils are provided.

9. The coil of claim 1, wherein said first capacitor connecting said second ends of conductors in a first coil is different in capacitance to said first capacitor connecting said second ends in a third coil.

10. In an MRI apparatus comprising:

means for providing a magnetic field in which a subject being examined is positioned; and means for receiving magnetic resonance signals from said subject; the improvement wherein an RF coil is provided comprising:

at least three separate, non-overlapping coils, each comprising a pair of flat elongated conductors disposed in an oblong structure with first and second ends of one conductor of each pair of conductors facing corresponding first and second ends of the other of each pair of conductors;

means for connecting corresponding first ends of said conductors of said pair of conductors;

a plurality of first capacitors, each interconnecting corresponding second ends of conductors of each said pair of conductors;

a plurality of second capacitors; and means for connecting each of said second capacitors to respective second ends of said conductors of each of said at least three coils.

11. The apparatus of claim 10, wherein said first capacitor connecting said second ends of conductors in a first coil is equal in capacitance to said first capacitor connecting said second ends in a third coil.

12. The apparatus of claim 10, further comprising means for decoupling at least one of said second capacitors from connection respective second ends of said conductors.

13. The apparatus of claim 12, wherein said means for decoupling comprises a pair of diodes.

14. The apparatus of claim 10, wherein said means for connecting comprises a plurality of third capacitors, each connected to said first ends of said conductors.

15. The apparatus of claim 10, wherein said conductors comprise a conductive metal, and are of a length of about 330 mm; having a radius of about 110 mm; a width of about 50 mm; and a thickness of about 1 mm; and wherein distance between each of said at least three coils is about 150 mm.

16. The apparatus of claim 10, wherein inductance between a first coil and a second coil is about 186.5 nH; inductance between said second coil and a third coil is about 186.5 nH; and inductance between said first coil and said third coil is about 69.5 nH.

17. The apparatus of claim 10, wherein four separate, non-overlapping coils are provided.

18. The apparatus of claim 10, wherein said magnetic fields are vertical magnetic fields, and said RF coils are positioned to receive or transmit in a horizontal direction.

19. In a nuclear magnetic resonance receiving method comprising the steps of providing a magnetic field in which a subject being examined is positioned; and receiving a magnetic resonance signal from said subject; the improvement wherein said magnetic resonance signals are received by an RF coil comprising:

at least three separate, non-overlapping coils, each comprising a pair of flat elongated conductors disposed in an oblong structure with first and second ends of one conductor of each pair of conductors facing corresponding first and second ends of the other of each pair of conductors;

means for connecting corresponding first ends of said conductors of said pair of conductors;

a plurality of first capacitors, each interconnecting corresponding second ends of conductors of each said pair of conductors;

a plurality of second capacitors; and means for connecting each of said second conductors to respective second ends of said conductors of each of said at least three coils.

20. The method of claim 19, wherein said first capacitor connecting said second ends of conductors in a first coil is equal in capacitance to said first capacitor connecting said second ends in a third coil; and further comprising means for decoupling at least one of said second capacitors from connection respective second ends of said conductors, said means for decoupling comprising a pair of diodes.

* * * * *